US 7,888,746 B2

(12) United States Patent
Tischler

(10) Patent No.: US 7,888,746 B2
(45) Date of Patent: Feb. 15, 2011

(54) SEMICONDUCTOR STRUCTURE AND METHOD OF MANUFACTURE

(75) Inventor: Michael Albert Tischler, Phoenix, AZ (US)

(73) Assignee: HVVi Semiconductors, Inc., Phoenix, AZ (US)

( * ) Notice: Subject to any disclaimer, the term of this patent is extended or adjusted under 35 U.S.C. 154(b) by 0 days.

(21) Appl. No.: 11/611,515

(22) Filed: Dec. 15, 2006

(65) Prior Publication Data

US 2008/0142923 A1 Jun. 19, 2008

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/379; 257/347; 257/E29.287; 438/21; 438/704; 438/149; 438/295

(58) Field of Classification Search ......... 257/379, 257/347–354, E29.287; 438/21.704, 149–166, 438/295, 311
See application file for complete search history.

(56) References Cited

U.S. PATENT DOCUMENTS

| | | | |
|---|---|---|---|
| 4,888,300 A * | 12/1989 | Burton | 438/404 |
| 5,254,491 A | 10/1993 | Boland et al. | |
| 5,519,250 A | 5/1996 | Numata | |
| 5,541,132 A | 7/1996 | Davies et al. | |
| 5,612,244 A | 3/1997 | Davies et al. | |
| 5,640,041 A | 6/1997 | Lur et al. | |
| 5,641,712 A | 6/1997 | Grivna et al. | |
| 5,688,700 A | 11/1997 | Kao et al. | |
| 5,792,706 A | 8/1998 | Michael et al. | |
| 5,846,849 A | 12/1998 | Shaw et al. | |
| 6,118,171 A | 9/2000 | Davies et al. | |
| 6,153,489 A | 11/2000 | Park et al. | |
| 6,180,995 B1 | 1/2001 | Hebert | |

(Continued)

FOREIGN PATENT DOCUMENTS

EP 1213748 A2 6/2002

(Continued)

OTHER PUBLICATIONS

Erzgraber, H.B. et al., "A Novel Buried Oxide Isolation for Monolithic RF Inductors on Silicon", *IEDM 98-535, IEEE 1998*, (1998), pp. 535-539.

(Continued)

*Primary Examiner*—Cuong Q Nguyen
*Assistant Examiner*—Cathy N Lam
(74) *Attorney, Agent, or Firm*—Cool Patent, P.C.; Kenneth J. Cool

(57) ABSTRACT

In various embodiments, semiconductor structures and methods to manufacture these structures are disclosed. In one embodiment, a semiconductor structure having a silicon-on-insulator (SOI) substrate and a dielectric region is disclosed. The dielectric region is adjacent to the active layer of the SOI substrate and the dielectric region includes a portion of a buried oxide (BOX) layer of the SOI substrate. At least a portion of the dielectric region extends from a surface of the active layer of the SOI substrate to a depth of at least about three microns or greater below the surface of the active layer. Other embodiments are described and claimed.

14 Claims, 6 Drawing Sheets

U.S. PATENT DOCUMENTS

| | | |
|---|---|---|
| 6,251,734 B1 | 6/2001 | Grivna et al. |
| 6,261,892 B1 | 7/2001 | Swanson |
| 6,271,106 B1 | 8/2001 | Grivna et al. |
| 6,307,247 B1 | 10/2001 | Davies |
| 6,455,393 B1 | 9/2002 | Swanson |
| 6,489,652 B1 | 12/2002 | Jeon et al. |
| 6,498,069 B1 | 12/2002 | Grivna |
| 6,503,838 B1 | 1/2003 | Swanson |
| 6,512,283 B2 | 1/2003 | Davies |
| 6,531,376 B1 | 3/2003 | Cai et al. |
| 6,586,833 B2 | 7/2003 | Baliga |
| 6,617,252 B2 | 9/2003 | Davies |
| 6,621,136 B2 | 9/2003 | Grivna |
| 6,661,068 B2 | 12/2003 | Durham et al. |
| 6,759,746 B1 | 7/2004 | Davies |
| 6,764,918 B2 | 7/2004 | Loechelt |
| 6,803,317 B2 | 10/2004 | Grivna |
| 6,939,788 B2 | 9/2005 | Davies |
| 6,984,860 B2 | 1/2006 | Grivna et al. |
| 7,019,358 B2 | 3/2006 | Amato |
| 7,078,784 B2 | 7/2006 | Davies |
| 7,087,925 B2 | 8/2006 | Grivna |
| 7,148,533 B2 | 12/2006 | Hsu et al. |
| 7,176,524 B2 | 2/2007 | Loechelt et al. |
| 7,202,152 B2 | 4/2007 | Davies |
| 7,253,477 B2 | 8/2007 | Loechelt et al. |
| 7,256,119 B2 | 8/2007 | Grivna et al. |
| 2002/0064928 A1 | 5/2002 | Houston |
| 2003/0062588 A1 | 4/2003 | Grivna |
| 2003/0067014 A1* | 4/2003 | Tsuruta et al. ............... 257/200 |
| 2003/0075776 A1 | 4/2003 | Ohkubo et al. |
| 2003/0160233 A1 | 8/2003 | Rendon et al. |
| 2004/0099896 A1 | 5/2004 | Zdebel et al. |
| 2006/0180858 A1 | 8/2006 | Loechelt et al. |
| 2006/0246652 A1 | 11/2006 | Grivna et al. |
| 2007/0034947 A1 | 2/2007 | Loechelt et al. |
| 2007/0075399 A1 | 4/2007 | Grivna |
| 2007/0093077 A1 | 4/2007 | Grivna |
| 2007/0148947 A1 | 6/2007 | Davies |
| 2007/0207582 A1 | 9/2007 | Grivna et al. |
| 2007/0277875 A1* | 12/2007 | Gadkaree et al. ............. 136/256 |

FOREIGN PATENT DOCUMENTS

| | | |
|---|---|---|
| WO | 2005/059961 A2 | 6/2005 |
| WO | 2008/076651 A1 | 6/2008 |

OTHER PUBLICATIONS

Y, Tan et al., "A SOI LDMOS/CMOS/BJT Technology for Fully-Integrated RF Power Amplifiers", (May 22, 2000),137-140 Pages.

International Search Report received for PCT Application No. PCT/US2007/086609 mailed on May 15, 2008, 3 pages.

* cited by examiner

SEMICONDUCTOR STRUCTURE AND METHOD OF MANUFACTURE

TECHNICAL FIELD

Embodiments disclosed in the present disclosure relate generally to electrical and semiconductor technology, and more specifically to a semiconductor structure that includes a dielectric structure.

BACKGROUND

For some applications, such as high frequency or radio frequency (RF) applications, it may be desirable to integrate passive devices such as inductors and/or capacitors together with active devices using conductive silicon substrates. However, passive devices may have relatively low quality factors (Q) when these passive devices are formed on, or in relatively close proximity to, the conductive silicon substrate. In addition, due to parasitic capacitive coupling between these passive devices and the conductive silicon substrate, the frequency of operation of the integrated devices is reduced.

Accordingly, it is desirable to have an improved integrated device that can achieve a relatively higher frequency of operation and has passive devices that have relatively higher quality factors.

For simplicity of illustration and ease of understanding, elements in the various figures are not necessarily drawn to scale, unless explicitly so stated. In some instances, well-known methods, procedures, components and circuits have not been described in detail so as not to obscure the present disclosure. The following detailed description is merely exemplary in nature and is not intended to limit the disclosure of this document and uses of the disclosed embodiments. Furthermore, there is no intention to be bound by any expressed or implied theory presented in the preceding text, including the title, technical field, background, or abstract.

DETAILED DESCRIPTION

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements.

Figure 1:
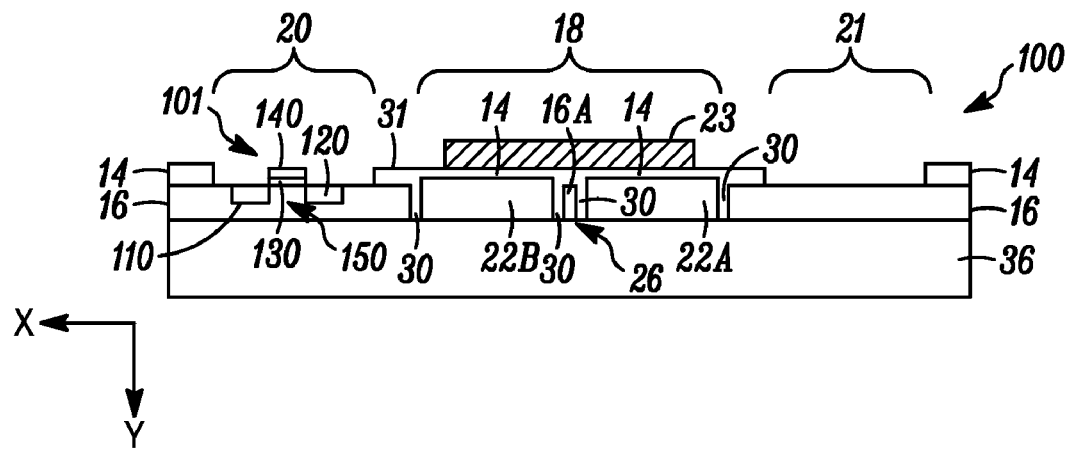
FIG. 1 is a cross-sectional view of a semiconductor structure.

FIG. 1 is a cross-sectional view of a semiconductor structure 100. FIG. 1 comprises a dielectric platform (DP) 18, active regions 20 and 21, and an electrically conductive material 23. Dielectric platform 18 may be referred to as a dielectric structure or a dielectric region, and active regions 20 and 21 may also be referred to as active areas or active area regions.

Dielectric platform 18 of semiconductor structure 100 comprises voids 22A and 22B, a portion of dielectric material 31, and a vertical structure 26. As will be discussed further below, at least a portion of dielectric platform 18 may be between electrically conductive material 23 and substrate 36 to reduce parasitic capacitance between electrically conductive material 23 and substrate 36. In other embodiments, at least a portion of dielectric platform 18 is between at least a portion of electrically conductive material 23 and at least a portion of substrate 36 to reduce capacitance between electrically conductive material 23 and substrate 36.

Active regions 20 and 21 may comprise a semiconductor material 16 over a substrate 36. In some embodiments, semiconductor material 16 may comprise silicon and may be referred to as a device layer or an active layer and semiconductor layer 16 may be used as an active area where active devices, such as, for example, transistors or diodes, or portions of active devices, may be subsequently formed. Active devices may be formed in active regions 20 and 21 using conventional complementary metal oxide semiconductor (CMOS), bipolar, or bipolar-CMOS (BiCMOS) processes.

Semiconductor material 16 may be doped with a chemical impurity or dopant such as, for example, boron, phosphorous, or arsenic, to establish its conductivity type (p-type or n-type) and resistivity. Substrate 36 may comprise a semiconductor material such as, for example, silicon, and may be doped or undoped depending on the application.

In some embodiments, the depth or thickness of dielectric platform 18 may range from about three microns (μm) to about forty microns and the width of dielectric platform 18 may be at least about five microns or greater. In some embodiments, the thickness of dielectric platform 18 may be about ten microns and the width of dielectric platform 18 may be about ten microns. In other embodiments, it may be desirable that the thickness of the dielectric platform be equal to, or approximately equal to, the thickness of semiconductor structure 100, that is, the thickness of the die.

Voids 22A and 22B may be referred to as cavities, air gaps, openings, empty regions, or empty spaces. In addition, as described herein, voids 22A and 22B are hermetically sealed to prevent any contamination from undesirable gasses or moisture that may propagate into, or get trapped in, voids 22A and 22B. When sealed, voids 22A and 22B may be referred to as sealed air gaps, sealed voids, closed cells, or closed cell voids.

Vertical structure 26 may be, for example, a pillar or a wall, and may comprise a portion of silicon layer 16 and a portion of dielectric material 31. The portion of layer 16 that is a part of structure 26 is labeled 16A. Material 16A is located in dielectric region 18 and is physically and electrically isolated from layers 16. Portions of layers 16 are in active areas 20 and 21. As is discussed below, active devices, or portions of active devices, are formed in layers 16 and are not formed in material 16A of structure 26. Accordingly, layers 16 may be referred to as active layers.

Vertical structure 26 may be used to form a plurality of sealed voids or closed cells in dielectric platform 18. Although a single vertical structure 26 is shown in FIG. 1, the methods and apparatuses described herein are not limited in this regard. For example, in alternate embodiments, a plurality of vertical structures may be formed in dielectric platform 18. And, in other embodiments, such as the embodiment illustrated below in FIG. 2, no vertical structures are formed in dielectric platform 18 and dielectric platform 18 has only a single sealed void 22 in these embodiments.

In embodiments wherein multiple voids are formed in dielectric platform 18, dielectric platform 18 has a closed-cell configuration in that the voids 22A and 22B of dielectric platform 18 may be physically isolated from each other by vertical structure 26. Accordingly, if there is any rupture or fracture in dielectric platform 18, contamination from any gases in voids 22A or 22B may be contained in a limited area due to the closed-cell configuration, wherein the multiple voids of dielectric platform 18 are physically isolated from each other.

The combination of vertical structure 26 and voids 22A and 22B reduces the overall permittivity of the dielectric platform 18 so that dielectric platform 18 has a relatively low dielectric constant. In some embodiments, a dielectric constant of about at least about 1.5 or lower may be achieved by increasing the volume of voids 22A and 22B.

The dielectric constant of dielectric platform 18 is reduced compared to, for example, what would be provided by a dielectric platform that has no air gaps or voids. Additionally, reduced thermal stress is induced in active layer 16 and substrate 36 compared to a solid or filled dielectric structure, because dielectric platform 18 includes substantial volumes that are not occupied by solids having coefficients of thermal expansion that differ from that of substrate 36 and active layer 16. Thermal stress can lead to dislocations and undesirable excessive leakage currents in devices formed in active layer 16 and substrate 36.

Silicon dioxide has a dielectric constant of about 3.9. Accordingly, a solid or filled dielectric structure that includes no voids and includes silicon dioxide may have a dielectric constant of about 3.9.

In some embodiments described herein, dielectric platform 18 includes voids occupying in excess of 40% of the total volume of dielectric platform 18. This may result in an effective dielectric constant reduction of about 30% or greater, from a dielectric constant of about 3.9 to an effective dielectric constant of about 2.74. In one embodiment, dielectric platform 18 includes voids occupying in excess of 50% of the total volume. This may result in an effective dielectric constant reduction of about 39%, from a dielectric constant of about 3.9 to an effective dielectric constant of about 2.39. Increasing the volume of air or empty space in dielectric platform 18 may result in a dielectric platform 18 having a dielectric constant of about 1.5 or less. As a result, passive elements 23 formed over dielectric platform 18 have reduced parasitic capacitances to the substrate 36. The parasitic substrate capacitance is reduced by both the reduced effective dielectric constant of dielectric platform 18 and the increased thickness of dielectric platform 18.

Dielectric platform 18 may also be used to provide electrical isolation in semiconductor structure 100. For example, dielectric platform 18 may be used to electrically isolate active regions 20 and 21 from each other, which may also result in electrical isolation between any active devices formed in active regions 20 and 21. In these embodiments, substrate 36 may be an electrical insulator and may have a relatively high thermal conductivity to facilitate the removal of heat generated during operation of any active devices formed in semiconductor structure 100. For example, substrate 36 may be formed of materials that are electrical insulators and have relatively high thermal conductivity such as, for example, polycrystalline silicon carbide (SiC) or aluminum nitride (AlN).

In addition, dielectric platform 18 may be used to increase the frequency of operation of any devices formed using semiconductor structure 100. For example, passive components such as, for example, inductors, capacitors, or electrical interconnects, may be formed over the embedded dielectric platform 18 and may have reduced parasitic capacitive coupling between these passive components and silicon substrate 36 since the embedded dielectric platform 18 has a relatively low dielectric constant or permittivity and since the embedded dielectric platform 18 increases the distance between the passive components and the conductive substrate. Reducing parasitic substrate capacitances may increase the frequency of operation of any devices formed using semiconductor structure 100. As an example, the passive component may comprise electrically conductive material 23, wherein electrically conductive material 23 may comprise, for example, aluminum, copper, or doped polycrystalline silicon. In various examples, the passive component may be an inductor, a capacitor, a resistor, or an electrical interconnect.

Further, dielectric platform 18 may be used to form relatively high quality passive devices such as, for example, capacitors and inductors having a relatively high quality factor (Q) since the dielectric platform 18 may be used to isolate and separate the passive devices from the substrate. Active devices, such as transistors or diodes, may be formed in regions adjacent to, or abutting, the dielectric platform 18, and these active devices may be coupled to and employ passive components such as spiral inductors, microstrip transmission lines and the like that are formed on a planar upper surface of dielectric platform 18. Separating the passive components from silicon substrate 36 allows higher Qs to be realized for these passive components.

As an example, a field effect transistor (FET) 101 may be formed in active region 20. FET 101 may be a MOSFET and may include a source region 110 in a portion of active layer 16, a drain region 120 in a portion of active layer 16, a gate oxide 130 over a portion of layer 16, a gate 140 over gate oxide 130, and a channel region 150 formed in a portion of layer 16 under gate oxide 130 and between doped regions 110 and 120. If substrate 36 is electrically nonconductive, then FET 101 may be electrically isolated from any active devices formed in layer 16 of active region 21 using dielectric platform 18.

In some embodiments, it may be desirable for substrate 36 to be electrically conductive. For example, substrate 36 may serve as part of a drain region of a vertical transistor formed in active region 21. In this example, a source contact or electrode (not shown) may be formed on or adjacent to an upper surface of active layer 16 and a drain electrode (not shown) may be formed on or adjacent to a lower surface of substrate 36. During operation, the electrical current flow from the source electrode to the drain electrode in the vertical transistor may be substantially perpendicular to the upper and lower surfaces of semiconductor structure 100. In other words, current flows essentially vertically through the vertical transistor from the electrode located adjacent a top surface of semiconductor structure 100 to a drain electrode located adjacent to the opposite bottom surface of semiconductor structure 100. An example of a vertical transistor is described in U.S. patent application Ser. No. 10/557,135, entitled "POWER SEMICONDUCTOR DEVICE AND METHOD THEREFOR," filed Nov. 17, 2005, which claims priority to Patent Cooperation Treaty (PCT) International Application Number PCT/US2005/000205 entitled "POWER SEMICONDUCTOR DEVICE AND METHOD THEREFOR," having an International Filing Date of Jan. 6, 2005 and an International Publication Date of Jul. 28, 2005, the contents of both of these patent applications are incorporated herein by reference in their entirety.

Although only a single active device is discussed as being formed in active layer 16 of active regions 20 and 21, the methods and apparatuses described herein are not limited in this regard. In some embodiments, a plurality of active devices may be formed in active layer 16 of active regions 20 and 21.

Since at least a portion of dielectric platform 18 is formed in and below the surface of the silicon substrate, dielectric platform 18 may be referred to as an embedded dielectric structure.

Figure 2:
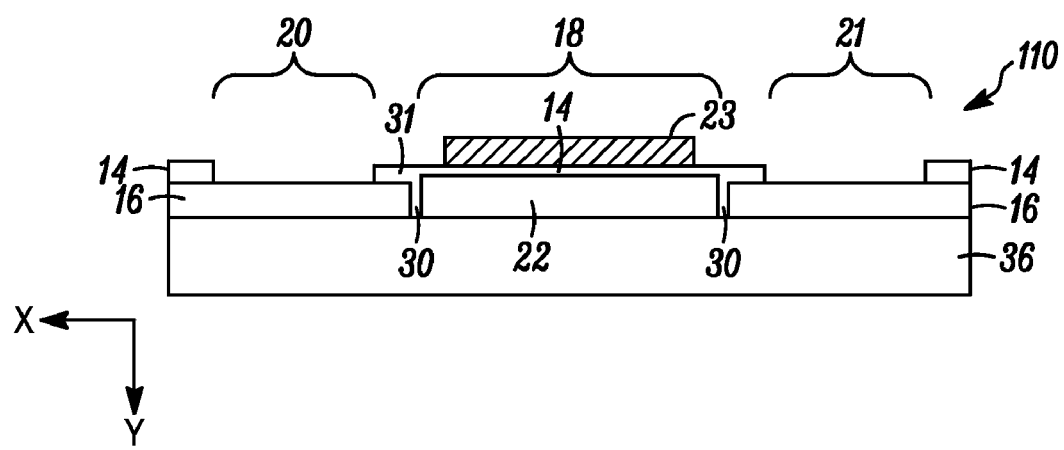
FIG. 2 is a cross-sectional view of another semiconductor structure.

FIG. 2 is a cross-sectional view of a semiconductor structure 110. Semiconductor structure 110 is similar to semiconductor structure 100 of FIG. 1. Dielectric platform 18 of semiconductor structure 110 does not include any vertical structures, such as vertical structure 26 (FIG. 1). Rather, dielectric platform 18 comprises a single void or air gap 22.

Figure 3:
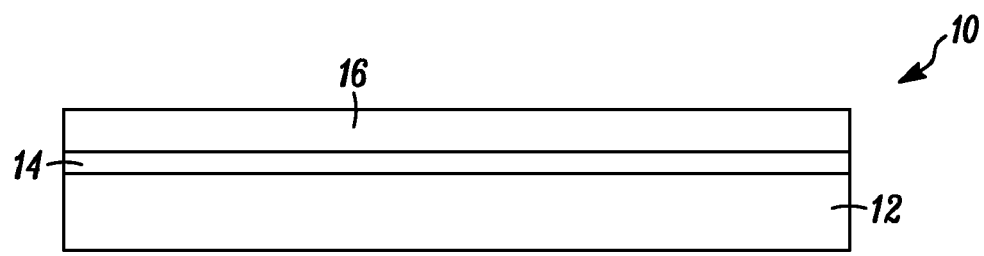
FIG. 3 is a cross-sectional view of a substrate.
Figure 13:
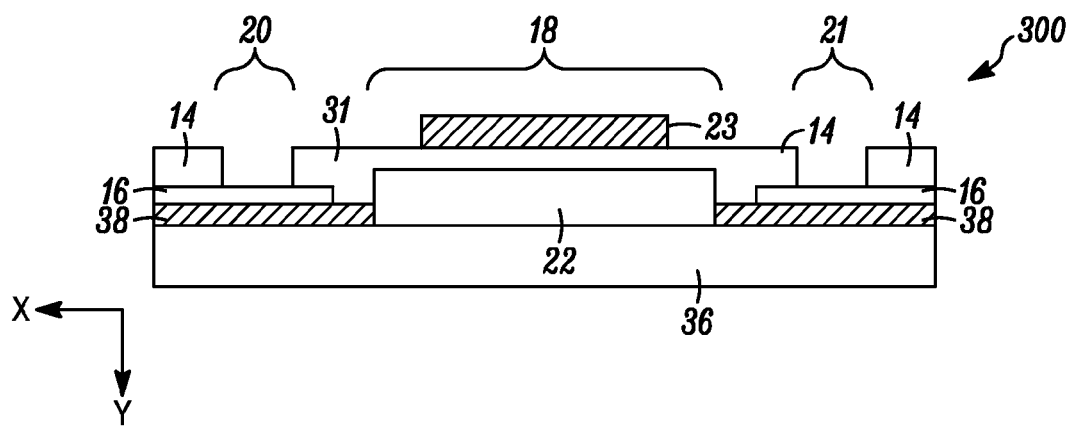
FIG. 13 is a cross-sectional view of the semiconductor structure of FIG. 12 at a later stage of fabrication.
Figure 14:
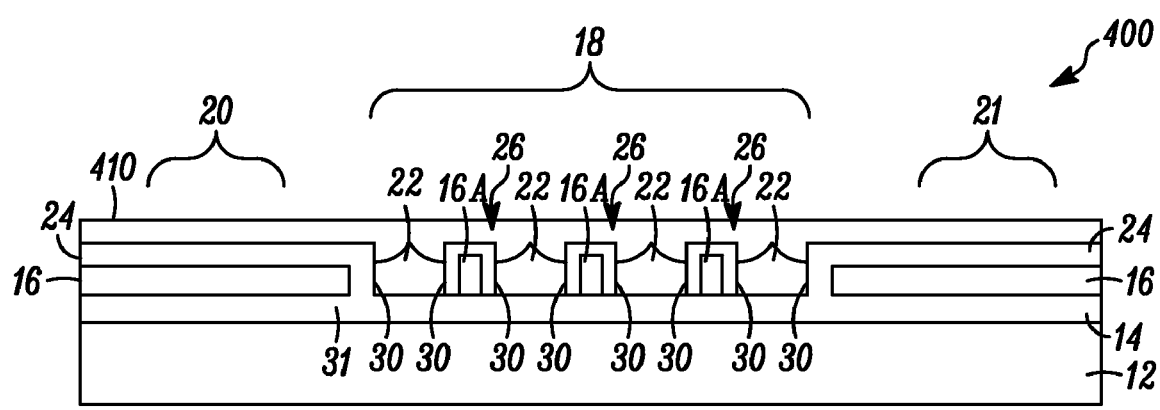
FIG. 14 is a cross-sectional view of another semiconductor structure during fabrication.

FIG. 3 is a cross-sectional view of a substrate 10, which may be used as a substrate for the fabrication of semiconductor structures 100 (FIG. 1), 110 (FIG. 2), 200 (FIG. 11), 300 (FIG. 13), and 400 (FIG. 14). Substrate 10 comprises a dielectric layer 14 formed over a base material 12 and a semiconductor material 16 formed over dielectric layer 14 to form substrate 10. Substrate 10 may be referred to as a silicon-on-insulator (SOI) substrate. In some embodiments, base material 12 may comprise silicon, silicon carbide, polycrystalline silicon carbide, and polycrystalline aluminum nitride. In embodiments wherein base material 12 comprises a semiconductor material, base material 12 may be referred to as a semiconductor material or a semiconductor layer. Base material 12 may have a thickness ranging from about 100 microns to about 1000 microns. However, the thickness of base material 12 may be reduced through subsequent thinning processes in some embodiments.

Dielectric layer 14 comprises, for example, silicon dioxide ($SiO_2$) and has a thickness ranging from about 1000 Angstroms (Å) to about 2 microns. Dielectric layer 14 may be referred to as a buried oxide (BOX) region or buried oxide layer.

In some embodiments, substrate 10 may be formed by bonding two silicon wafers with oxidized surfaces. For example, one wafer may comprise layer 12, and a second wafer may comprise layer 16, and a silicon dioxide layer may be formed on each wafer using deposition techniques or thermal growth techniques such as, for example, thermal oxidation of silicon. After forming the interface oxide layers, the wafers may be bonded together by placing the interface oxides in contact with each other. The wafer that includes layer 16 may be thinned or polished down to a desired thickness with the combined interface oxide layers becoming buried oxide layer 14 and layer 16 becoming an active layer where active devices may be formed.

In other embodiments, substrate 10 may be formed by separation by implantation of oxygen (SIMOX). SIMOX may include implanting oxygen ions into a silicon substrate and using a relatively high temperature anneal to form buried oxide 14.

Portions of silicon dioxide layer 14 may be used to form dielectric platform 18 of semiconductor structures 100 (FIG. 1), 110 (FIG. 2), 200 (FIG. 11), 300 (FIG. 13), and 400 (FIG. 14). In some embodiments, base material 12 may be a sacrificial material that initially serves as a base material for forming semiconductor structures 100 (FIG. 1), 110 (FIG. 2), 200 (FIG. 11), and 300 (FIG. 13) and may be later removed as discussed below. In other embodiments, such as the embodiment discussed with reference to FIG. 14, base material 12 may be a substrate layer or a support layer to provide mechanical support and/or a thermal conductive path for removing heat from semiconductor structure 400 (FIG. 14).

Semiconductor layer 16 may be referred to as a device layer or an active layer and may be used as, or as part of, an active area or active region where active devices (not shown), or portions of active devices, such as, for example, transistors or diodes, may be subsequently formed. For example, active areas 20 and 21 of semiconductor structures 100 (FIG. 1), 110 (FIG. 2), 200 (FIG. 11), 300 (FIG. 13), and 400 (FIG. 14) may include at least a portion of semiconductor layer 16. In addition, portions of transistor 101 (FIG. 1) may be formed in semiconductor layer 16 of active area 20.

In some embodiments, semiconductor layer 16 may comprise silicon, have a thickness ranging from about three microns to about forty microns, and may be doped with an n-type dopant such as, for example, arsenic or phosphorous, and have a doping concentration of about $1.0 \times 10^{15}$ atoms/$cm^3$. In embodiments wherein a vertical transistor is formed using semiconductor layer 16, the thickness and dopant concentration of layer 16 is increased or decreased depending on the desired drain-to-source breakdown voltage ($BV_{DS}$) rating of the vertical transistor.

As is discussed in more detail below with reference to FIG. 9, a wafer 36 is bonded to layer 16 in some embodiments. In these embodiments, it may be desirable that the interface between wafer 36 and layer 16 have relatively low electrical resistance. This may be achieved by forming two different doping characteristics in layer 16. For example, a lower portion of layer 16 which is closest to BOX layer 14 may have a relatively low doping concentration and the upper portion of layer 16 which includes the surface or interface that will be bonded to wafer 36 may be more heavily doped than the lower portion of layer 16. In some embodiments, the lower portion of layer 16 may be doped with an n-type dopant such as, for example, arsenic or phosphorous, and have a doping concentration of about $1.0 \times 10^{15}$ atoms/$cm^3$. The upper portion of layer 16 may be doped with an n-type dopant such as, for example, arsenic or phosphorous, and may be doped to have a resistivity in range of approximately 0.001 to about 0.005 ohm-cm (Ω-cm). In these embodiments, wafer 36 may have doping characteristics that match, or substantially match, the doping characteristics of the upper or contact portion of layer 16. For example, wafer 36 may be doped with an n-type dopant such as, for example, arsenic or phosphorous, and may be doped to have a resistivity in range of approximately 0.001 to about 0.005 Ω-cm. The doping characteristics for layer 16 may be set using implantation or diffusion techniques, or layer 16 may be formed using conventional epitaxial growth techniques.

Figure 4:
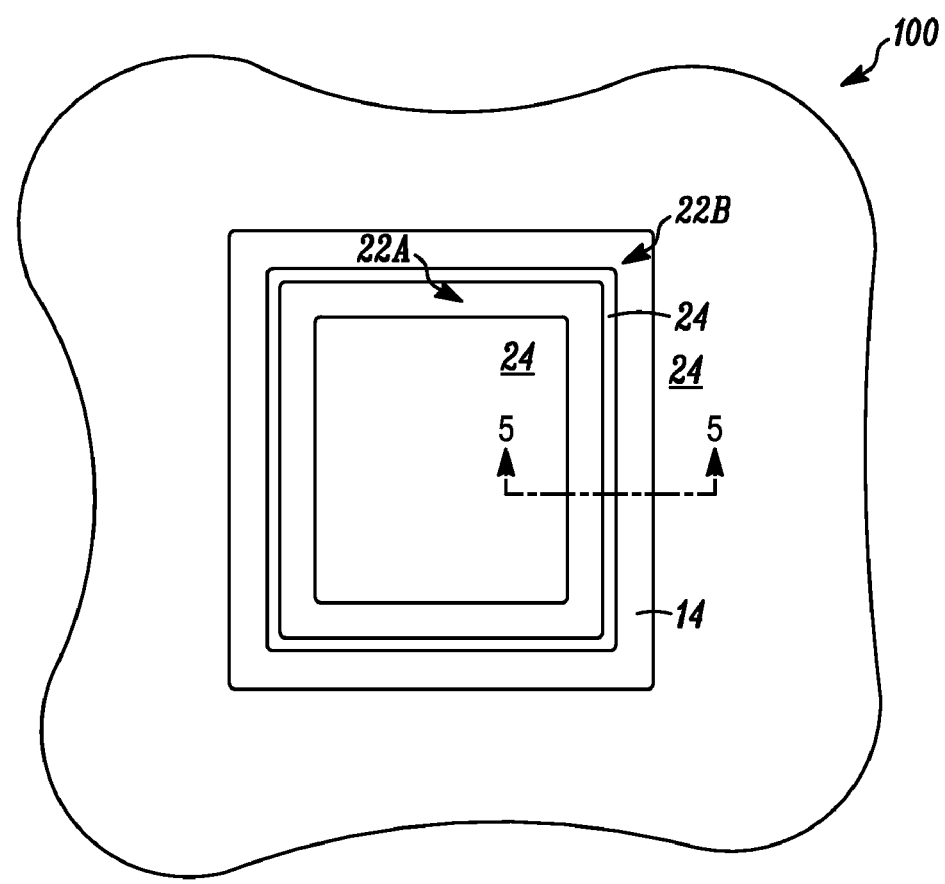
FIG. 4 is a plan view of the semiconductor structure of FIG. 1 at an early stage of fabrication.

FIG. 4 is a plan view of semiconductor structure 100 at an early stage of fabrication. At the stage illustrated in FIG. 4, a dielectric layer 24 is formed over semiconductor layer 16 (FIG. 3) and an opening or trench 22 is formed in semiconductor structure 100. Trench 22 is used to form the voids or air gaps 22A and 22B (FIG. 1) of the resulting dielectric platform 18 (FIG. 1). FIG. 4 shows an embodiment wherein dielectric platform 18 may be used for isolating regions of semiconductor layer 16 from each other, although the methods and apparatuses described herein are not limited in this regard. In the embodiment illustrated in FIG. 4, the resulting dielectric platform surrounds at least a portion of active layer 16.

Figure 5:
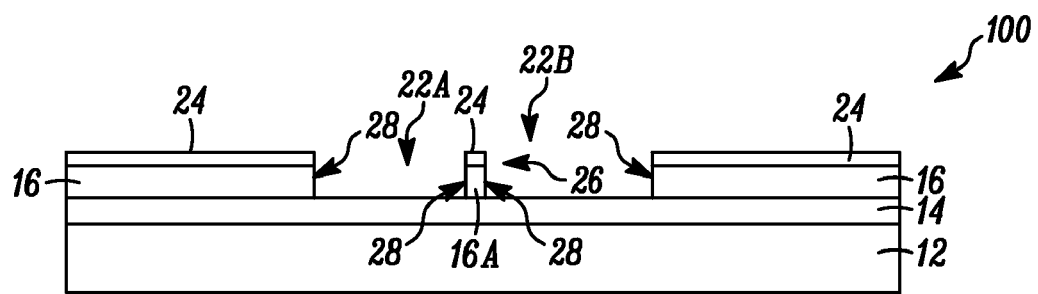
FIG. 5 is a cross-sectional side view of the semiconductor structure of FIG. 4 taken along section line 5-5 of FIG. 4.

FIG. 5 is a cross-sectional side view of semiconductor structure 100 taken along section line 5-5 of FIG. 4. Dielectric layer 24 comprises, for example, silicon dioxide (SiO$_2$) and has a thickness ranging from about 100 Angstroms (Å) to about 5000 Angstroms. Dielectric layer 24 may be formed using deposition techniques or thermal growth techniques such as, for example, thermal oxidation of silicon.

After dielectric layer 24 is formed, layers 16 and 24 may be patterned using photolithography and etching processes. Photolithography processes or operations involve the use of masks and may sometimes be referred to as masking operations or acts. The photolithography and etching may include forming a layer of a radiation-sensitive material, such as photoresist (not shown), over dielectric layer 24, then exposing the photoresist using, for example, ultraviolet (UV) radiation to form a mask, and then etching portions of layers 24 and 16 using the photoresist mask and two etches, stopping at BOX layer 14 to form openings, trenches, or cavities 22A and 22B.

Silicon dioxide layer 24 may be etched using a wet chemical etch or a dry etch process such as, for example, a reactive ion etch (RIE). A portion of semiconductor layer 16 may next be removed using an anisotropic etch process such as, for example, reactive ion etching (RIE), that may be selective to silicon such that BOX layer 14 serves as an etch stop layer. The etching of semiconductor layer 16 forms sidewalls 28 that are relatively straight or vertical. After the etching of semiconductor layer 16, the photoresist over oxide layer 24 is stripped or removed.

Dielectric layer 24 may serve as a hard mask, and may be referred to as a masking layer. Since the photoresist (not shown) over layer 24 is also etched as part of the silicon etch used to etch layer 16, dielectric layer 24 may be used as a hard mask to prevent the undesired etching of the upper surface of layers 16 and 16A during the formation of trench 22. In alternate embodiments, the photoresist layer may be made relatively thick which would make dielectric layer 24 optional.

As is shown in FIG. 5, one or more vertical structures 26 may be formed as part of the etching of layers 24 and 16. Vertical structure 26 may be used for mechanical support in dielectric platform 18 (FIG. 1) as well as a partition for forming multiple closed cells or voids in dielectric platform 18.

Although multiple openings 22A and 22B are shown as being formed in FIG. 5, the methods and apparatuses described herein are not limited in this regard. For example, in alternate embodiments such as the embodiment illustrated in FIG. 6, a single opening 22 may be formed in layers 24 and 16, and the semiconductor structure shown in FIG. 6 may be used to form semiconductor structure 110 (FIG. 2) and semiconductor structure 300 (FIG. 13).

Figure 7:
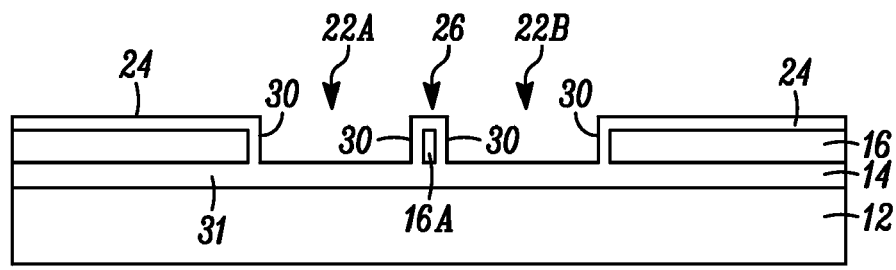
FIG. 7 is a cross-sectional view of the semiconductor structure of FIG. 5 at a later stage of fabrication.

FIG. 7 is a cross-sectional view of semiconductor structure 100 at a later stage of fabrication. After forming openings 22A and 22B, a thermal oxidation process is performed to oxidize sidewalls 28 of semiconductor materials 16 and 16A and form silicon dioxide layers 30. Layers 24, 30, and 14 form a continuous oxide layer, and this continuous oxide layer is labeled with reference number 31 in the figures. The thickness of the silicon dioxide layers 30 may be varied as part of the thermal oxidation process. In some embodiments, the thickness of layers 30 may range from about 100 Angstroms to about 5000 Angstroms. In one example, the thickness of layers 30 may be about 1000 Angstroms.

The thermal oxidation process may be performed so that some of material 16 (labeled 16A) remains in structure 26, however the methods and apparatuses described herein are not limited in this regard. In other embodiments, all of the semiconductor material 16A of structure 26 may be consumed during the thermal oxidation process. Reducing the amount of semiconductor material 16A in vertical structure 26 will reduce the effective dielectric constant of dielectric platform 18.

Figure 8:
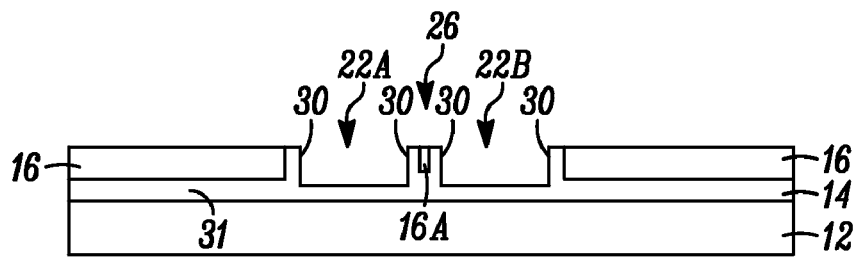
FIG. 8 is a cross-sectional view of the semiconductor structure of FIG. 7 at a later stage of fabrication.

FIG. 8 is a cross-sectional view of semiconductor structure 100 at a later stage of fabrication. After the thermal oxidation of sidewalls 28, the dielectric material over layers 16 and 16A is removed to expose a surface of semiconductor layers 16 and 16A. For example, the portions of dielectric material 31 over layers 16 and 16A may be removed using, for example, an anisotropic etch which preserves the portions 30 of dielectric material 31 that contact semiconductor layers 16 and 16A. This anisotropic etch will also remove portions of dielectric material 31 at the bottoms of openings 22A and 22B. As an example, a dry etch such as, for example, a reactive ion etch (RIE) may be used to remove the portions of dielectric material 31 at the bottoms of openings 22A and 22B and over layers 16 and 16A after the thermal oxidation of sidewalls 28.

Although not shown in the figures, in other embodiments, after the thermal oxidation of sidewalls 28, the portions of dielectric material 31 may be removed by forming a layer of silicon nitride (Si$_3$N$_4$) (not shown) over dielectric material 31, then performing an anisotropic etch of the silicon nitride layer to form nitride spacers (not shown) that cover portions 30 of dielectric material 31 and leave exposed portions of dielectric material 31 at the bottoms of openings 22A and 22B and over layers 16 and 16A, and then performing a wet chemical etch to remove the exposed portions of dielectric material 31, while preserving the portions 30 of dielectric material 31 that contact semiconductor layers 16 and 16A.

Figure 9:
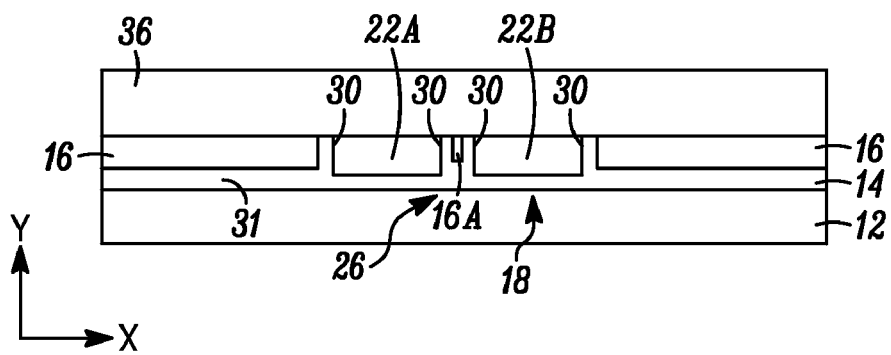
FIG. 9 is a cross-sectional view of the semiconductor structure of FIG. 8 at a later stage of fabrication.

FIG. 9 is a cross-sectional view of semiconductor structure 100 at a later stage of fabrication. After the dielectric material over layers 16 and 16A is removed to expose surfaces of semiconductor layers 16 and 16A, voids 22A and 22B may be sealed using, for example, wafer bonding.

Wafer bonding may refer to a process in which two wafers are bonded together to form a single substrate. To form a relatively high quality bond between the two wafers, the bonding surfaces or interfaces of the two wafers should be relatively flat or planar and be relatively clean. Further, wafer bonding refers to a process by which two mirror polished wafers adhere to each other at room temperature without the application of any macroscopic gluing layer or outside force. It is also known as direct bonding or fusion bonding. Bonding at room temperature may result in a relatively weak bond and these wafers may undergo heat treatment to strengthen the bonds across the interface. Surface forces that hold the wafers together include electrostatic, capillary, and/or Van der Waals forces. Subsequent high temperature annealing may form the bonds between two contacted materials. Wafer bonding may be used to bond semiconductor materials of the same type together, for example, two silicon wafers, or may be used to bond semiconductors materials of different types together, for example a silicon wafer may be bonded to a compound semiconductor substrate such as, for example, gallium arsenide (GaAs) substrate. In addition, as is discussed below with reference to FIG. 10, wafer bonding may be used to bond a semiconductor material to a wafer having an electrically conductive material, such as a metal layer, at its interface.

Referring to FIG. 9, a wafer or substrate 36 is bonded to the semiconductor structure shown in FIG. 8 using wafer bonding. In particular, a surface of substrate 36 is put into contact with the exposed surfaces of layers 16 and 16A to bond substrate 36 to layers 16 and 16A and to hermetically seal openings 22A and 22B. As discussed above, substrate 36 may be electrically conductive or nonconductive, and may have a relatively high thermal conductivity depending on the application. In some embodiments, substrate 36 may comprise doped or undoped silicon, and substrate 36 may have doping characteristics that match, or substantially match, the doping characteristics of the upper portion or contact portion of layer 16.

Depending on the application for semiconductor structure 100, the sealing of voids 22A and 22B may be performed in a vacuum so that voids 22A and 22B do not contain any gasses. A vacuum may create less pressure on the walls of voids 22A and 22B during thermal processing, and this may reduce the possibility of rupturing by heating In other embodiments, a gas having a relatively high thermal conductivity such as, for example, hydrogen or helium, may be formed in voids 22A and 22B as part of the sealing process.

After bonding substrate 36 to layers 16 and 16A, base material 12 may be removed by, for example, polishing or etching back layer 12 to BOX layer 14. Then, portions of BOX layer 14 over layer 16 may be removed using photolithography and etching processes to pattern dielectric layer 31 and expose portions of layers 16 as shown in FIG. 1. As may be appreciated, the structure shown in FIG. 9 is rotated 180 degrees relative to the structure shown in FIG. 1.

Referring to FIG. 1, after the patterning of dielectric layer 31, an electrically conductive material 23 may be formed over dielectric platform 18 and FET 101 may be formed in active region 20 to form structure 100 shown in FIG. 1. Dielectric platform 18 of semiconductor structure 100 comprises voids 22A and 22B, a portion of buried oxide layer 14 of SOI substrate 10 (FIG. 3), silicon dioxide layers 30, and semiconductor layer 16A.

As is illustrated in FIG. 1, dielectric platform 18 is adjacent to, or contacting, portions of active layer 16, and at least a portion of dielectric platform 18 is below a plane (not shown) that is coplanar to, or substantially coplanar to, a surface of active layer 16. In some embodiments, the portion of dielectric platform 18 below the plane extends from the plane to a depth of at least about three microns or greater below the plane and the portion of dielectric platform 18 below the plane has a width of at least about five microns or greater. In other words, at least a portion of dielectric platform 18 extends from a surface of active layer 16 to a depth of at least about three microns or greater below the surface of active layer 16.

Figure 10:
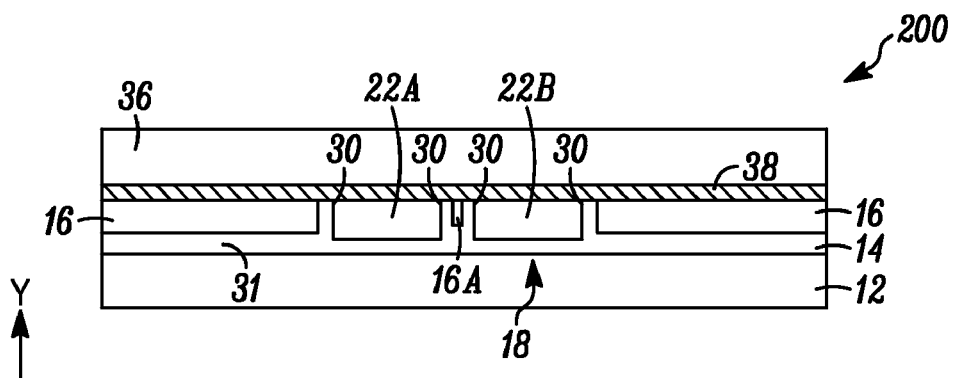
FIG. 10 is a cross-sectional view of another semiconductor structure during fabrication.

FIG. 10 is a cross-sectional view of a semiconductor structure 200 during fabrication in accordance with another embodiment. Similar to the embodiment illustrated in FIG. 9, after the dielectric material 24 over layers 16 and 16A is removed to expose a surface of semiconductor layers 16 and 16A, voids 22A and 22B may be sealed using, for example, wafer bonding. However, in the embodiment illustrated in FIG. 10, an electrically conductive material 38 may be formed on a surface of substrate 36 prior to the bonding of substrate 36 to layers 16 and 16A.

Electrically conductive material 38 may comprise a metal, and may include one or more electrically conductive layers. For example, electrically conductive material 38 may comprise an adhesion layer and/or an anti-diffusion or barrier layer. In some embodiments, electrically conductive material 38 may comprise aluminum (Al), copper (Cu), gold (Au), tungsten (W), tantalum (Ta), titanium (Ti), or nickel (Ni). The thickness of electrically conductive material 38 may range from about 1000 Angstroms to about twenty microns. Electrically conductive material 38 may be formed by plating, evaporation, or a sputter deposition of an electrically conductive material on a surface of substrate 36. After the deposition of electrically conductive material 38 and prior to the wafer bonding, electrically conductive material 38 may be polished or planarized using, for example, chemical mechanical polishing (CMP), to form a relatively high quality bond during wafer bonding. After the formation of electrically conductive material 38 on a surface of substrate 36, material 38 of substrate 36 is bonded to semiconductor materials 16 and 16A using wafer bonding.

In an alternate embodiment, electrically conductive material 38 may be formed over the structure shown in FIG. 8 prior to the wafer bonding. In this embodiment, the metal that was deposited in portions of voids 22A and 22B is removed prior to the wafer bonding.

Figure 11:
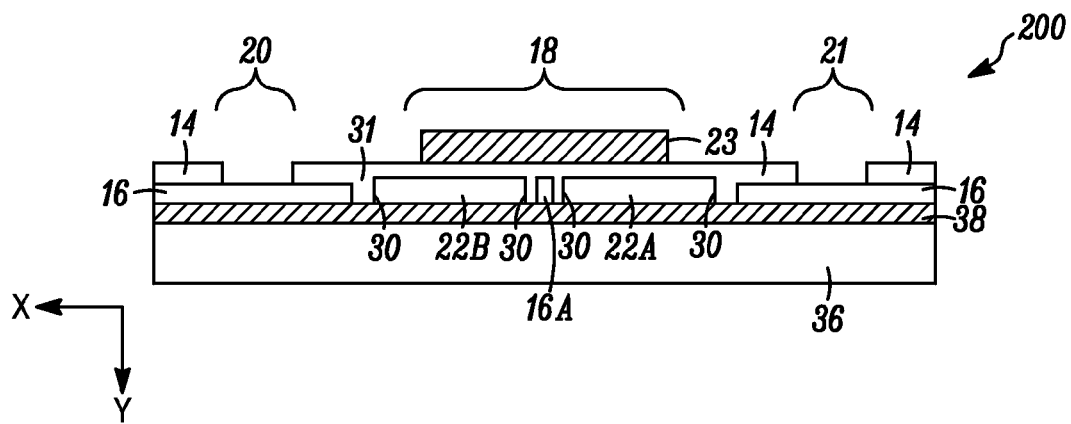
FIG. 11 is a cross-sectional view of the semiconductor structure of FIG. 10 at a later stage of fabrication.

FIG. 11 is a cross-sectional view of semiconductor structure 200 at a later stage of fabrication. After bonding metal layer 38 of substrate 36 to semiconductor layers 16 and 16A, base material 12 may be removed by, for example, polishing or etching back layer 12 to BOX layer 14. Then, portions of BOX layer 14 over layer 16 may be removed using photolithography and etching processes to pattern dielectric layer 31 to expose portions of layer 16 and form structure 200 as shown in FIG. 11. As may be appreciated, the structure shown in FIG. 11 is rotated 180 degrees relative to the structure shown in FIG. 10.

Figure 12:
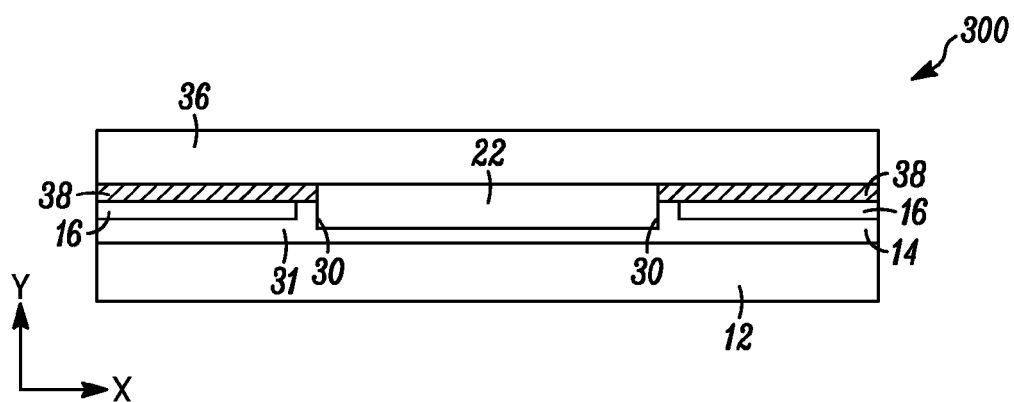
FIG. 12 is a cross-sectional view of another semiconductor structure during fabrication.

FIG. 12 is a cross-sectional view of semiconductor structure 300 during fabrication in accordance with another embodiment. In this embodiment, it may be desirable to reduce the amount of electrically conductive material 38 in dielectric platform region 18 (FIG. 13) of semiconductor structure 300. For example, reducing the amount of electrically conductive material 38 in dielectric platform region 18 will reduce the effective dielectric constant of dielectric platform 18.

Figure 6:
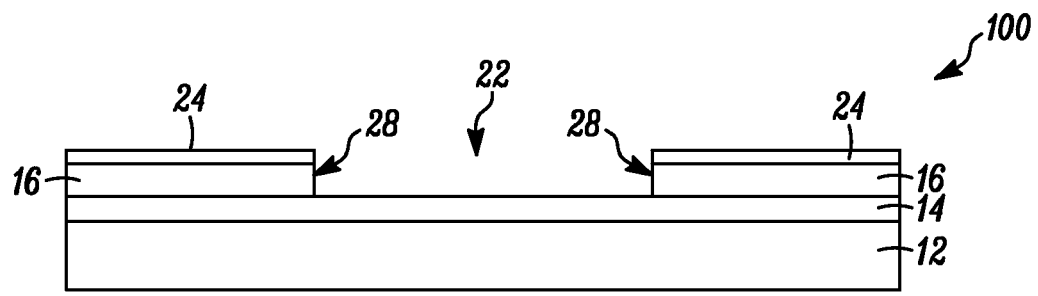
FIG. 6 is a cross-sectional view of the semiconductor structure of FIG. 2 at an early stage of fabrication.

The semiconductor structure shown in FIG. 6 may be used to form semiconductor structure 300. Similar to the processing of the semiconductor structure shown in FIG. 5, after forming opening 22, sidewalls 28 may be oxidized to form silicon dioxide layers 30. Then an anisotropic etch may be used to remove portions of dielectric material 31 at the bottom of opening 22 and over layer 16.

Referring again to FIG. 12, an electrically conductive material 38 may be formed over a surface of substrate 36 using, for example, a deposition process. Electrically conductive material 38 is patterned to remove a portion of material 38 that will be over opening 22 after the bonding of material 38 to layer 16. After the deposition and patterning of electrically conductive material 38, material 38 of substrate 36 is bonded to semiconductor material 16 using wafer bonding.

In an alternate embodiment, electrically conductive material 38 may be formed on layer 16 and on dielectric layer 31, and then may be selectively removed to expose portions of dielectric material 31 adjacent opening 22. In this embodiment, after the deposition and patterning of electrically conductive material 38, material 38 that is on layer 16 is bonded to substrate 36 using wafer bonding.

FIG. 13 is a cross-sectional view of semiconductor structure 300 at a later stage of fabrication. After bonding metal layer 38 of substrate 36 to semiconductor layer 16, base material 12 may be removed by, for example, polishing or etching back layer 12 to BOX layer 14. Then, portions of BOX layer 14 over layer 16 may be removed using photolithography and etching processes to pattern dielectric layer 31 to expose portions of layer 16 and form structure 300 as shown in FIG. 13. As may be appreciated, the structure shown in FIG. 13 is rotated 180 degrees relative to the structure shown in FIG. 12.

In some embodiments, electrically conductive material 38 may serve as an electrode or contact of an active device formed in active areas 20 or 21. Electrical contact can be made to electrically conductive material 38 either through the top side or through the bottom side of structure 300.

FIG. 14 is a cross-sectional view of a semiconductor structure 400 in accordance with another embodiment. A structure similar to the structure shown in FIG. 7 may be used to form semiconductor structure 400.

Semiconductor structure 400 includes a plurality of vertical structures 26 to form a plurality of openings or trenches 22. After the performing of a thermal oxidation process to form silicon dioxide layers 30, a capping layer 410 such as, for example, an oxide layer (for example, a tetraethylorthosilicon (TEOS) oxide layer), may be formed over dielectric layer 24 and in portions of openings 22 to seal the voids 22. Accordingly, if the capping layer 410 experiences a rupture or fracture, contamination from any gases in voids 22 may be contained in a limited area due to the closed-cell configuration, wherein voids 22 are physically isolated from each other.

As an example, using chemical vapor deposition (CVD) or gas deposition techniques, a dielectric layer such as, for example, oxide layer 410, is formed to cap or seal openings 22. For example, a hot wall TEOS or plasma TEOS oxide may be deposited such that the deposited oxide material builds up in each opening 22, gradually reducing the size of each opening until openings 22 are closed forming a dielectric layer 410 at the upper portions of openings 22, wherein the remaining lower portions of openings 22 are not filled. After openings 22 are sealed using oxide layer 410, openings 22 may be referred to as chambers, voids, closed cells, air gaps, sealed void, or sealed air gaps. The thickness of oxide layer 410 may range from about 8,000 Angstroms to about 12,000 Angstroms, and in one example may be about 9,000 Angstroms. Oxide layer 410 may seal openings 22 to isolate openings 22 from potential contamination from undesirable gases.

In some embodiments, optional planarization of the resultant structure may be performed, to provide a planar upper surface for structure 400. For example, a chemical mechanical planarization (CMP) process may be used to planarize the upper surface of structure 400 after the deposition of oxide layer 410.

As may be appreciated, the width of openings 22 may be adjusted to facilitate forming oxide layer 410 at the upper portions of openings 22 and not in the lower portions of openings 22. For example, the widths of openings may be reduced to prevent the formation of oxide layer 410 at the bottom or lower portions of openings 22. In one embodiment, the width or diameter of each opening 22 ranges from about 0.5 microns to about 1 micron.

Semiconductor structure 400 includes an alternate embodiment of a dielectric platform 18 formed using an SOI substrate. Passive devices such as an inductor or electrical interconnect may be formed over dielectric platform 18. In addition, active devices may be formed in semiconductor layer 16 of active areas 20 and 21, and active devices formed in active area 20 may be electrically isolated from active devices formed in active area 21.

Dielectric platform 18 of structure 400 comprises a portion of buried oxide layer 14 of SOI substrate 10 (FIG. 3), silicon dioxide layers 30, voids 22, vertical structures 26, and a portion of dielectric layer 410. At least a portion of dielectric platform 18 of structure 400 extends from a surface of active layer 16 to a depth of at least about three microns or greater below the surface of active layer active 16. In addition, a lower portion of dielectric platform 18 is adjacent to, abuts, or contacts a portion of substrate layer 12, a lateral portion of the dielectric platform 18 is adjacent to, abuts, or contacts a portion of active layer 16, and an upper portion of the dielectric platform 18 is coplanar to, substantially coplanar to, or above the surface of active layer 16.

Accordingly, various structures and methods have been disclosed to provide a relatively thick, embedded dielectric platform that may be a dielectric support structure capable of supporting one or more passive devices over the dielectric platform. In various embodiments, the disclosed dielectric platform may provide electrical isolation, reduce parasitic substrate capacitance, allow for the formation of passive devices having a relatively high quality factor (Q), and enable relatively higher frequency of operation of any devices formed using, or in conjunction with, a structure that includes the dielectric platform. In addition, the disclosed dielectric platform and the methods for making the dielectric platform may reduce thermal stress that may be imparted to regions adjacent to the dielectric platform compared to other techniques and structures. Further, methods and apparatuses have been disclosed that provide a semiconductor structure having a relatively high thermal conductivity, which may be advantages in applications where the efficient removal of heat is desired.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A semiconductor device, comprising:
    a silicon-on-insulator (SOI) substrate having a substrate layer, a buried oxide (BOX) layer, and an active layer, wherein the buried oxide layer is at least partially disposed between the substrate layer and the active layer; and
    a dielectric region adjacent the active layer, wherein the dielectric region comprises a portion of the buried oxide layer, wherein at least a portion of the dielectric region extends from a surface of the active layer to a depth of at least about three microns or greater below the surface of the active layer;

wherein the dielectric region has one or more voids formed therein and wherein the dielectric region and the one or more voids at least partially surround at least a portion of the active layer, the at least partially surrounded portion of the active layer being external to the dielectric region.

2. The semiconductor device of claim 1, wherein a surface of the dielectric region is coplanar to, substantially coplanar to, or above, the surface of the active layer.

3. The semiconductor device of claim 1, wherein the active layer has a thickness of at least about three microns.

4. The semiconductor device of claim 1, wherein a thickness of the dielectric region is at least about three microns and a width of the dielectric region is at least about five microns.

5. The semiconductor device of claim 1, wherein a lower portion of the dielectric region is adjacent to a portion of the substrate layer, a lateral portion of the dielectric region is adjacent to at least part of the active layer, and an upper portion of the dielectric region is coplanar to, substantially coplanar to, or above the surface of the active layer.

6. The semiconductor device of claim 1, wherein the substrate comprises a semiconductor material.

7. The semiconductor device of claim 6, wherein the semiconductor material comprises silicon and wherein the active layer comprises silicon.

8. The semiconductor device of claim 1, wherein the dielectric constant of the dielectric structure is less than about 3.9 and wherein the dielectric structure includes one or more voids occupying in excess of about 40% of the total volume of the dielectric structure.

9. The semiconductor device of claim 1, wherein the dielectric constant of the dielectric region is about 1.5 or less.

10. The semiconductor device of claim 1, wherein the dielectric region has a dielectric constant approximately equal to or less than a dielectric constant of silicon dioxide.

11. The semiconductor device of claim 1, wherein the dielectric region comprises silicon dioxide.

12. The semiconductor device of claim 1, wherein the dielectric region includes a plurality of closed cells.

13. The semiconductor device of claim 1, wherein the dielectric region includes a plurality of vertical structures.

14. The semiconductor device of claim 1, wherein the dielectric region is a dielectric support structure to support a passive device over the dielectric support structure.

* * * * *